United States Patent
Honma

(10) Patent No.: US 7,194,340 B2
(45) Date of Patent: Mar. 20, 2007

(54) METHOD OF CONTROLLING THE NUMBER OF REVOLUTIONS OF FAN IN ELECTRONIC DEVICE

(75) Inventor: Hiroyuki Honma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/430,675

(22) Filed: May 9, 2006

(65) Prior Publication Data
US 2006/0203449 A1   Sep. 14, 2006

Related U.S. Application Data

(63) Continuation of application No. PCT/JP03/14766, filed on Nov. 19, 2003.

(51) Int. Cl.
G05D 23/00 (2006.01)
H05K 7/20 (2006.01)

(52) U.S. Cl. .................... 700/300; 361/695
(58) Field of Classification Search ........... 700/300; 361/695; 318/471; 236/49.3; 454/184
See application file for complete search history.

(56) References Cited

U.S. PATENT DOCUMENTS

| 6,157,897 A | 12/2000 | Yoshikawa |
| 6,319,114 B1 * | 11/2001 | Nair et al. ............ 454/184 |

FOREIGN PATENT DOCUMENTS

| JP | 64-7926 | * 1/1989 |
| JP | 05-223346 | 8/1993 |
| JP | 06-140782 | 5/1994 |
| JP | 07-180878 | 7/1995 |
| JP | 08-030357 | 2/1996 |
| JP | 10-002592 | 1/1998 |
| JP | 10-222777 | 8/1998 |

OTHER PUBLICATIONS

International Search Report dated Jan. 20, 2004 for corresponding International Application PCT/JP03/14766.

* cited by examiner

*Primary Examiner*—Leo Picard
*Assistant Examiner*—Steven R. Garland
(74) *Attorney, Agent, or Firm*—Katten Muchin Rosenman LLP

(57) ABSTRACT

An electric device is provided that can provide an electronic device capable of maintaining the temperature in an apparatus approximately constant at a low cost without installing any temperature sensor. In a method of controlling the number of revolutions of forced-air-cooling fans in an electronic device having a plurality of circuit boards and the forced-air-cooling fans that discharge the heat generated from the plurality of circuit boards through ventilation, and each of which is equipped with a filter, the optimal number of revolutions for each fan is obtained from the relation between the accumulated time of use of the filter and the power consumption of the plurality of circuit boards mounted in the electronic device and a driving current of the forced-air-cooling fans is controlled such that the number of the revolutions becomes the obtained number of revolutions.

6 Claims, 6 Drawing Sheets

| THE YEAR OF MANUFACTURE | THE MONTH OF MANUFACTURE | SERIAL NUMBER |
|---|---|---|
| 00~31 | 1~12 | 0001~2048 |
| "xxxxx" | "xxxx" | "xxxxxxxxxxx" | x : 0 or 1

| CLEANING INFORMATION | CLEANING COMPLETED OR NOT |
|---|---|
| 0 | COMPLETED |
| 1 | NOT COMPLETED |

FIG. 8
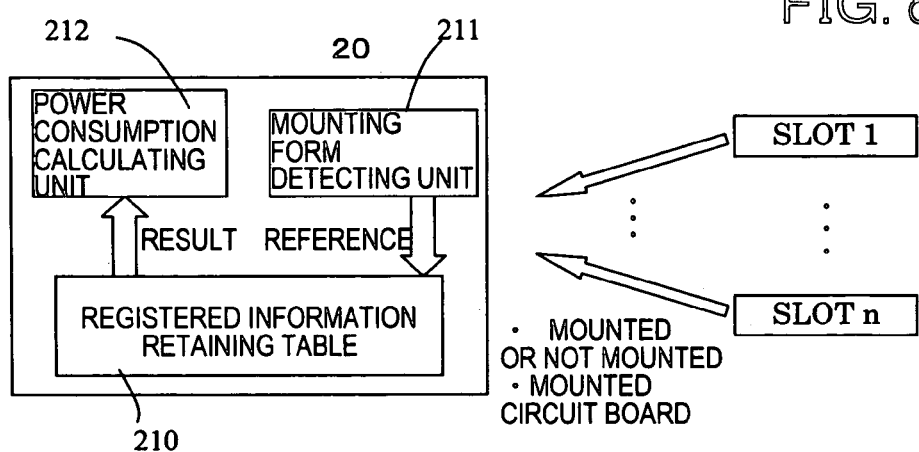
FIG. 9
| CIRCUIT BOARD (CARD) NAME | POWER CONSUMPTION (W) |
|---|---|
| "A" | a |
| "B" | b |
| "C" | c |
| "D" | d |
| "E" | e |
| "CPU" | f |
FIG. 10
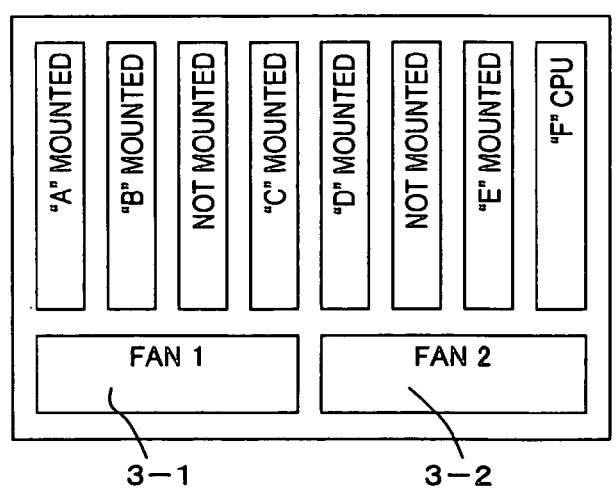

| ACCUMULATED TIME OF USE OF FILTER POWER CONSUMPTION | ~ 500 day | 500~ 1000 day | 1000~ 1500 day | 1500~ 2000 day | 2000 day ~ |
|---|---|---|---|---|---|
| ~ A (W) | a | b | c | d | e |
| A ~ B (W) | b | c | d | e | f |
| B ~ C (W) | c | d | e | f | g |
| C ~ D (W) | d | e | f | g | h |
| D ~ E (W) | e | f | g | g | i |
| E ~ F (W) | f | g | h | i | j |

METHOD OF CONTROLLING THE NUMBER OF REVOLUTIONS OF FAN IN ELECTRONIC DEVICE

CROSS-REFERENCE TO RELATED APPLICATIONS

This application is a continuation of international application PCT/JP2003/014766, filed on Nov. 19, 2003.

INDUSTRIAL FIELD OF APPLICATION

The present invention relates to a method of controlling the number of revolutions of a fan in an electronic device. More specifically, the invention relates to a method of controlling the number of revolutions of a fan in a transmitting apparatus that is mounted with a plurality of circuit boards therein.

BACKGROUND ART

A transmitting apparatus as one of electronic devices is also often installed outside a station building and, in such a case, the transmitting apparatus needs to operate at an environmental temperature ranging from −40° to +65°.

In such a temperature environment, a transmitting apparatus is mounted with a forced-air-cooling fan (FAN) therein for ventilation as a measure especially against a high temperature and the role of the fan is important to improve the reliability of the apparatus.

Controlling the number of revolutions of the forced-air-cooling fan in response to the variation of the temperature can be considered. However, to achieve this, a configuration that is adapted to detect the environmental temperature and feedback it to a circuit that controls the number of revolutions is necessary.

However, such a feedback configuration is difficult to employ in terms of the cost of the apparatus, etc.

On the other hand, as a technique concerning the control of revolution of a fan, a technique is known, for controlling the revolution of a cooling fan for a housing of a plurality of packages that are mounted in an information processing apparatus (see Patent Document 1: Japanese laid open patent publication Tokukai-Hei 8-30357).

The technique described in Patent Document 1 determines, in response to the number of the packages mounted in the apparatus, the number of cooling fans for which the revolution is controlled by the technique, or the number of revolutions of each of the fans.

That is, in the above conventional example, the number of cooling fans or the number of revolutions of each of the fans are determined in response to the power consumption determined by the number of the packages mounted in the apparatus.

On the other hand, as practical operation, conventionally, filters (Filter) have been equipped corresponding to fans and a constant amount of air flow has been maintained by replacing the filters at a proper interval by a user to avoid clogging of the filters. In such a case, a work of replacing the filters at a proper interval considering the clogging is necessary for the user.

In such a case, because the number of revolutions of the fans is constant immediately after the replacement of the filters compared to that before the replacement, the amount of air flow sent to the apparatus has become significantly different and it is difficult to maintain the temperature in the apparatus within a pre-determined range.

Because a minimum amount of air flow needs to be continuously sent regardless of the clogging of the filters, the number of revolutions often results in a number that is more than needed, and this leads to waste of the power consumption of the fans themselves.

For example, a sufficient amount of air flow can be supplied with 1000 revolutions immediately after the replacement of a filter. However, assuming that approximately 10,000 revolutions is necessary when the clogging is heavy, in a conventional apparatus, a fan needs to be continuously operated at 10,000 revolutions including the technique described in Patent Document 1, and extra power is necessary.

SUMMARY OF THE INVENTION

Therefore, considering the above, the object of the present invention is to provide a method of controlling the number of revolutions of a fan in an electronic device, that can reduce the extra power consumption.

A first aspect of a method of controlling a fan in an electric device according to the present invention, that achieves the objective of the present invention, is a method of controlling the number of revolutions of a forced-air-cooling fan in an electronic device having a plurality of circuit boards; and the forced-air-cooking fan equipped with a filter that discharges the heat generated from the plurality of circuit boards through ventilation, wherein an appropriate number of revolutions of the fan is obtained from the relation between the accumulated time of use of the filter and the power consumption of the plurality of circuit boards mounted in the electronic device; and the driving current of the forced-air-cooling fan is controlled such that the obtained number of revolution is achieved.

A second aspect of the method of controlling a fan in an electric device according to the present invention, that achieves the above objective of the present invention is a method wherein, in the first aspect, for each filter, individual identification information and cleaning information that indicates whether or not cleaning has been completed are retained; counting of the time having passed is started simultaneously when the filter is mounted; and the accumulated time of use of the filter is detected.

A third aspect of a method of controlling a fan in an electric device according to the present invention, that achieves the objective of the present invention is a method wherein, in the first aspect, the type and the slot position to be mounted to of each of the plurality of the circuit boards that are mounted in the electronic device, and the number of those circuit boards are detected and the corresponding power consumption to be loaded on the forced-air-cooling fans is calculated.

The electronic device according to the present invention that achieves the above objective of the present invention includes a plurality of slots each capable of being mounted with a circuit board, forced-air-cooling fans each having a filter and equipped in each corresponding pre-determined slot of the plurality of slots, a fan card having identification information of the filters, a unit that inputs the identification information of a filter that is read from the fan card and obtains the accumulated time of use of a filter corresponding to the identification information, a unit that inputs information of the circuit boards mounted in the plurality of slots and obtains the power consumption corresponding to the mounted circuit boards, and a unit that obtains the number of revolutions of the forced-air-cooling fans to be set, from the relation between the obtained accumulated time of use of the filter and the power consumption corresponding to the mounted circuit boards.

The second aspect of the electronic device according to the present invention that achieves the above objective of the present invention is an electronic device of the first aspect, wherein the identification information of the filter is identified using the year of manufacture, the month of manufacture, and the serial number of the filter.

The third aspect of the electronic device according to the present invention that achieves the above objective of the present invention is an electronic device of the second aspect, further including a timer, wherein the accumulated time of use of the filter is counted by the timer starting when the filter is newly mounted and, when any change occurs to the identification information of the filter, the counting by the timer is stopped and the accumulated time of use of the filter is obtained from the count value at this time.

The features of the present invention will become more apparent from embodiments of the invention that will be described hereinbelow with reference to the accompanying drawings.

BRIEF DESCRIPTION OF THE DRAWINGS

FIG. 8 is an explanatory view of calculation of the power consumption.

FIG. 9 shows a portion of information registered in a registered information retaining table 210.

FIG. 10 is an explanatory view of the power consumption calculation in a power consumption calculating unit 212.

DETAILED DESCRIPTION OF PREFFERED EMBODIMENT

Figure 1:
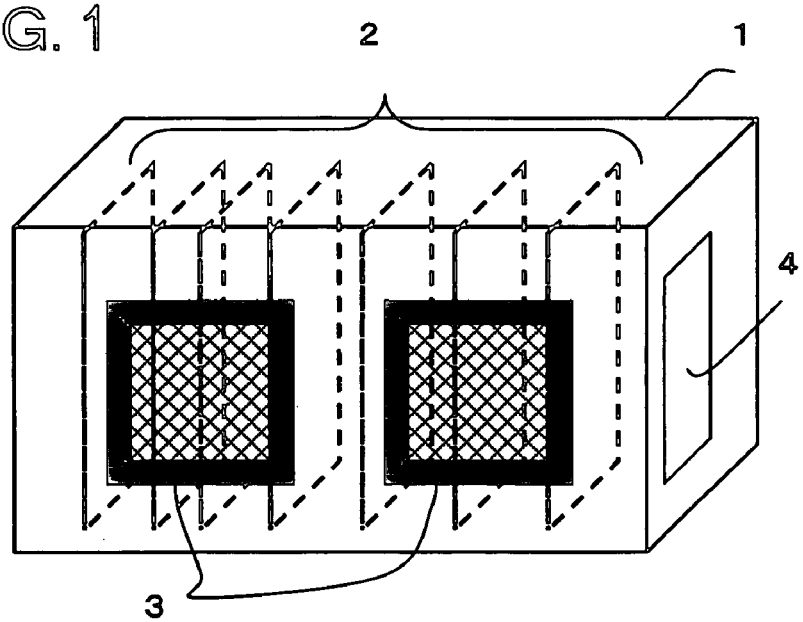
FIG. 1 is a conceptual perspective view of an embodiment of a transmission apparatus as an electronic device applied with the present invention.

An embodiment of the present invention will now be described with reference to the drawings. The embodiment shown in the drawings is for understanding of the present invention and the technical scope of the present invention is not limited to the embodiment.

Figure 2:
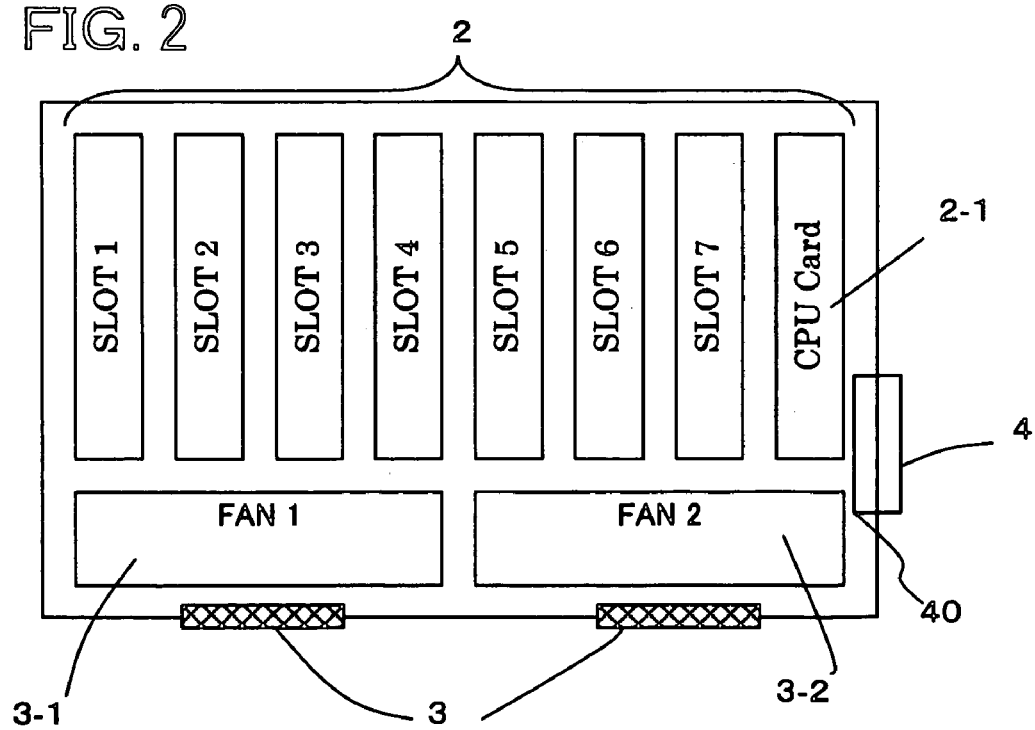
FIG. 2 is an explanatory view of the device configuration of the embodiment.

FIG. 1 is a conceptual perspective view of the embodiment of a transmission apparatus as an electronic device applied with the present invention. FIG. 2 is an explanatory view of the configuration of the electronic device.

In FIG. 1, a plurality of circuit boards 2 with a functional circuit respectively formed thereon are mounted in an electronic device housing 1. Two forced-air-cooling fans, as an example, are further mounted in the electronic device housing 1 and ventilating windows 3 for ventilating toward outside are formed on a side of the electronic device housing 1.

As a feature of the present invention, a fan card having characteristic information of a filter attached to each of the forced-air-cooling fans, is attached to another side of the electronic device housing 1.

FIG. 2 is a conceptual configuration diagram of the arrangement of the interior obtained when the electronic device is seen from above. In the electronic device housing 1, a plurality of slots respectively mounted with each of the plurality of circuit boards 2, eight slots in the example of FIG. 2, are shown.

The plurality of slots are respectively provided with a connector, not shown, for electrically connecting each of the circuit boards 2 mounted therein. Necessary mutual connection is provided between the plurality of circuit boards 2 mounted therein through track lines on a back board also not shown.

As an example, in a slot 2-1, a circuit substrate (hereinafter, "CPU substrate") is mounted, that controls the entire circuit and is formed thereon with a functional unit to be mounted with a CPU that controls the number of revolutions of a fan of the invention. Two forced-air-cooling fans 3-1 and 3-2 are provided between the ventilating windows 3 and the plurality of slots, facing respectively corresponding one of the ventilating windows 3.

A unit 40 that reads information for identifying a filter attached to each of the forced-air-cooling fans 3-1 and 3-2 (hereinafter, simply "filter information") from the fan card 4 that stores the filter information, and converts the filter information into an electric signal is provided facing the fan card 4.

Figures 3, 4, 5:
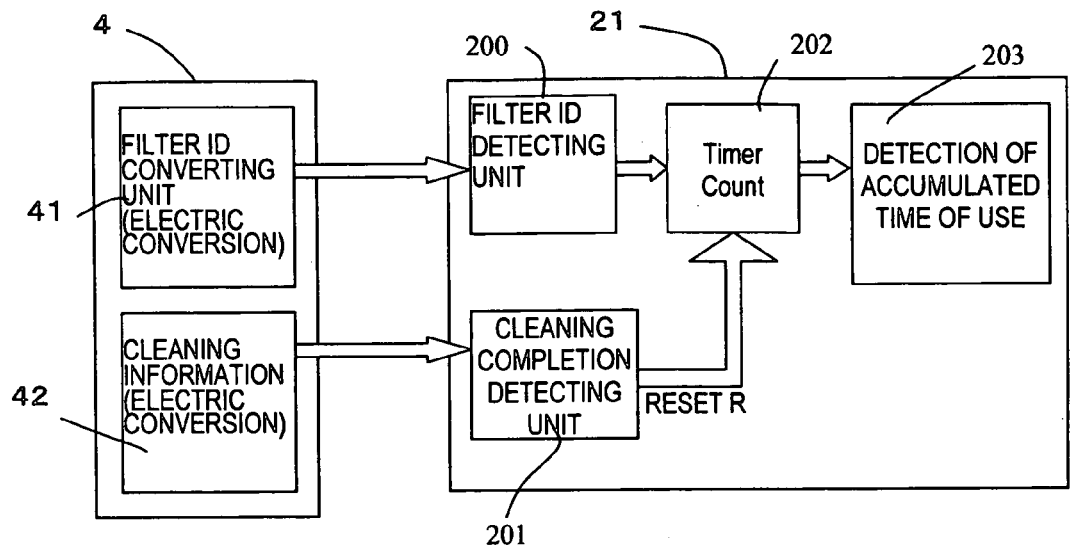
FIG. 3 is an explanatory view of the connection between information of a fan card 4 and a CPU-mounted circuit board 20 to be mounted in a slot 2-1.
FIG. 4 is an explanatory view of the content of a filter ID 41 for identifying a filter.
FIG. 5 is an explanatory view of information indicating whether or not cleaning for the filter has been completed.

FIG. 3 is an explanatory view of the connection between the fan card 4 and a circuit board 20 having a CPU and to be mounted in a slot 2-1.

The fan card 4 stores a filter ID 41 for identifying a corresponding filter as filter information provided corresponding to the forced-air-cooling fans 3-1 and 3-2, and information indicating whether or not cleaning for the filter has been completed.

FIG. 4 is an explanatory view of the content of the filter ID 41 for identifying a filter. In FIG. 4, as an example, the filter ID 41 has the year of manufacture, the month of manufacture, and the serial number (No.) of each of the filters represented by 20-digit dots of 0/1 for identifying IDs. That is, the filter ID 41 is enabled to represent the year of manufacture from the year 2000 to 2031 by five dots, the month of manufacture from January to December by four dots, and the serial number from 0001 to 2048 by 11 dots.

FIG. 5 is an explanatory view of information indicating whether or not cleaning for the filter has been completed and this is represented by 0/1.

Figure 6:
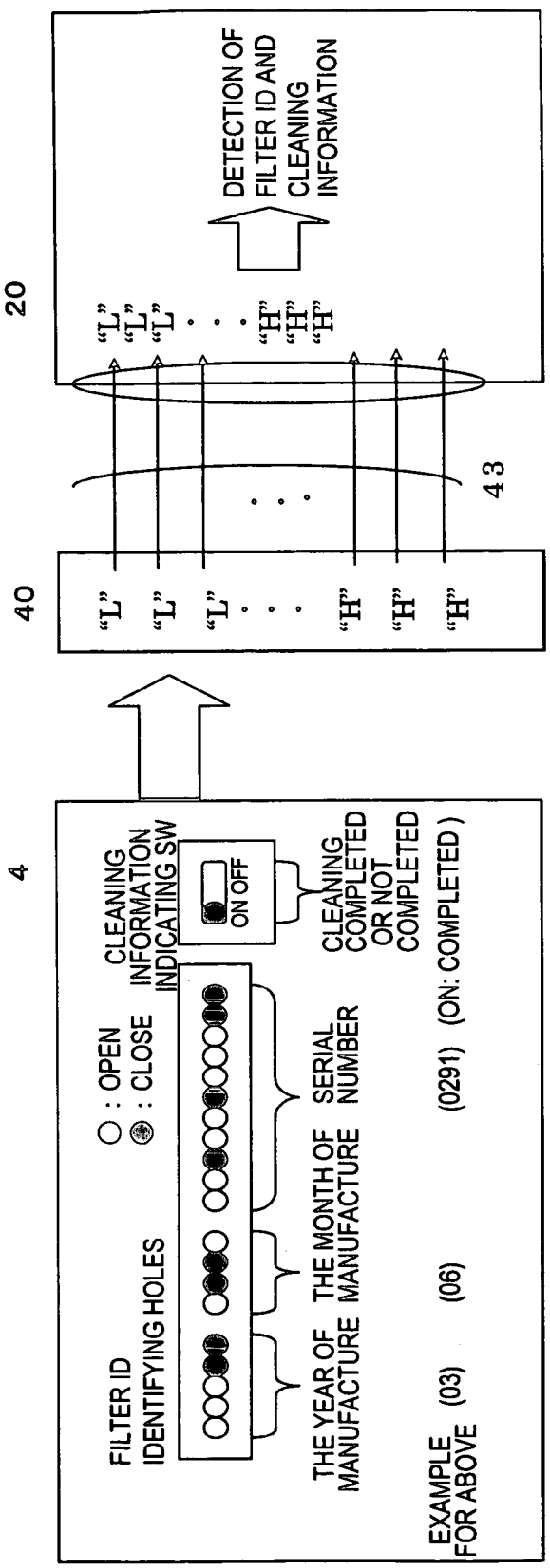
FIG. 6 shows an embodied example of the filter ID 41 for identifying the filter and the fan card 4 showing information indicating whether or not cleaning for the filter has been completed, of FIGS. 4 and 5.

FIG. 6 shows an example of the filter ID 41 for identifying the filter of FIGS. 4 and 5, and the filter information stored in the fan card 4, that has the information indicating whether or not cleaning for the filter has been completed, of FIGS. 4 and 5. That is, in FIG. 6, the fan card 4 represents 21-digit dot information by the presence and absence of holes at 21-digit pre-determined positions. A white circle indicates the presence of a hole and represents bit information, "0".

On the contrary, a black circle, "o" indicates closure of a hole at a pre-determined position and represents bit information, "1".

In FIG. 6, by the unit 40 formed with a combination of light emitting diodes and light receiving diodes, that converts the bit information into an electric signal, the bit information formed in the fan card 4 is outputted as the electric signal.

That is, emission from a light emitting diode of the unit 40 that converts the bit information into an electric signal is reflected from a position of a black circle at which a hole of the fan card 4 is closed and is detected by a light receiving diode, and an electric signal at a "H" level corresponding to bit information "1" is outputted. On the contrary, because no light is reflected from the position of a white circle at which a hole has been made and that indicates bit information, "0", an electric signal at a "L" level corresponding to bit information, "0" is outputted. These electric signals are inputted into the CPU substrate 20 by the direct current (DC) track line 41.

In the example of FIG. 6, the filter ID that identifies a filter that is stored has the year of manufacture constituted of (03), the month of manufacture constituted of (06), and the serial number constituted of (0291), and information indicating whether or not cleaning has been completed indicating "has been completed".

Direct current (DC) lines 43 connecting the unit 40 that converts bit information into the electric signal and the CPU substrate 20 are respectively pulled up. Therefore, when all the DC lines 43 are at "H" level, this indicates that the filter card 4 is removed and, when the DC lines 43 show values other than the above, this indicates that filters of the filter IDs respectively at the values are mounted.

Returning to FIG. 3, in the CPU substrate 20, the inputted "H"-level or "L"-level electrical signal is lead to a filter ID detecting unit 200 and a cleaning completion detecting unit 201.

In the filter ID detecting unit 200, identification information of the filter ID 41 that identifies a filter is detected as a combination of the "H"-level and "L"-level electric signals. Similarly, in the cleaning completion detecting unit 201, the "H"-level or the "L"-level electrical signal is detected respectively as indicating that the cleaning of a filter has been completed or not completed.

The operation of the CPU substrate 20 of FIG. 3 according to the present invention using the above detected signal will be described referring to the operational flow of FIG. 7.

Figure 7:
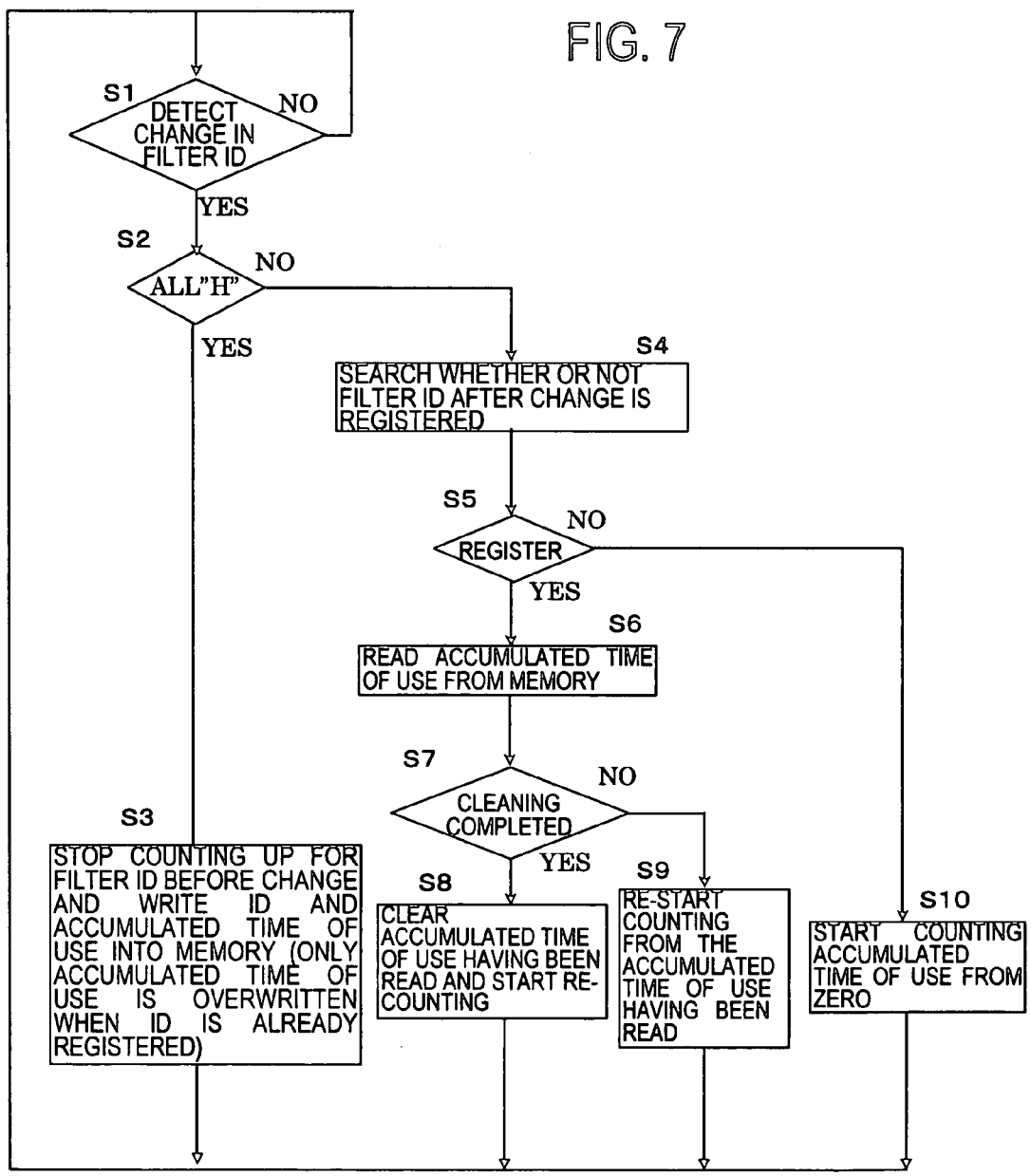
FIG. 7 is an explanatory operational flow of the operation of a CPU substrate 20 of FIG. 3, using an operational flow.

In FIG. 7, when the filter ID is detected at the filter ID detecting unit 200 (step S1, Yes), whether or not all bits are at the "H" level is determined (step S2).

Because the filter card 4 is removed as described above when all bits are at the "H" level, counting of a timer 202 for the filter ID before a change is stopped and the accumulated time of use is written into a memory 203 together with the filter ID (step S3). When the filter ID has been already registered, only the accumulated time of use is overwritten.

Returning to step S1, the continuous monitoring on the filter ID is continued.

At step S2, when not all the bits of a filter ID detected at the filter ID detecting unit 200 are at the "H" level (step S2, No), whether or not the detected filter ID is registered in the memory is searched (step S4).

When the detected filter ID is not registered, the counting of the timer 202 starts counting from zero (step S10) and, returning to step S2 again, the continuous monitoring to check whether or not any conversion occurs to the filter ID is continued.

At step S5, when the detected filter ID has been already registered, the accumulated time of use of the filter ID is read from the memory 203 (step S6).

When the completion of cleaning is detected at the cleaning completion detecting unit 202 (step S7, Yes), the accumulated time of use having been read is cleared and the re-counting by the timer 202 is started (step S8). Returning to step S2 again, the continuous monitoring to check whether or not any conversion occurs to the filter ID is continued.

When the non-completion of cleaning is detected at the cleaning completion detecting unit 201 (step S7, No), the counting by the timer 202 is continued starting from the accumulated time of use having been read (step S9).

As described above, whether or not the replacement of the filter has been changed, and the value counted by the timer 202 that is mounted are stored in the memory 203.

On the other hand, by a CPU, not shown, mounted on the CPU substrate, information on the mounting state is received from each slot mounted on the circuit boards 2 and each of the power consumptions to be loaded respectively on the electronic device and fans 3-1 and 3-2 is calculated.

FIG. 8 is an explanatory view of the calculation of the above power consumption. The CPU substrate 20 has a registered information retaining table 210 that registers information on the power consumption for the circuit boards 2 that can be mounted.

FIG. 9 shows a portion of the information registered in the registered information retaining table 210, and the type of each circuit board 2 (card name) and the power consumption for each circuit board 2 are registered.

A mounting form detecting unit 211 detects whether or not a circuit board 2 is mounted in each slot and, when mounted, the type of the circuit board 2 as well. That is, the mounting form detecting unit 211 detects the type of, the position of the slot that is mounted with, and the quantity of the plurality of circuit boards 2 mounted in the electronic device.

Based on the above information, information for calculating the power consumption corresponding to the circuit boards 2 that have been mounted, that is, the power consumption to be loaded on the corresponding forced-air-cooling fans is retrieved referring to the registered information retaining table 210 and is sent to a power consumption calculating unit 212.

The power consumption calculating unit 212 calculates the power consumption as follows for an example of FIG. 10 based on the information on the power consumption having been sent thereto. In the example shown in FIG. 10, three types A, B, and C of circuit boards 2 in the plurality of slots facing a first forced-air-cooling fan 3-2 are mounted and two types D and C of circuit boards 2 in the plurality of slots facing a second forced-air-cooling fan 302 are mounted.

In the above case, the power consumption for the first forced-air-cooling fan 3-1 is calculated as a+b+c and the power consumption for the second forced-air-cooling fan 3-2 is calculated as d+e, where a, b, c, d, and e are respectively the power consumption of the type A, B, C, D, and E of circuit boards 2.

Figures 11, 12:
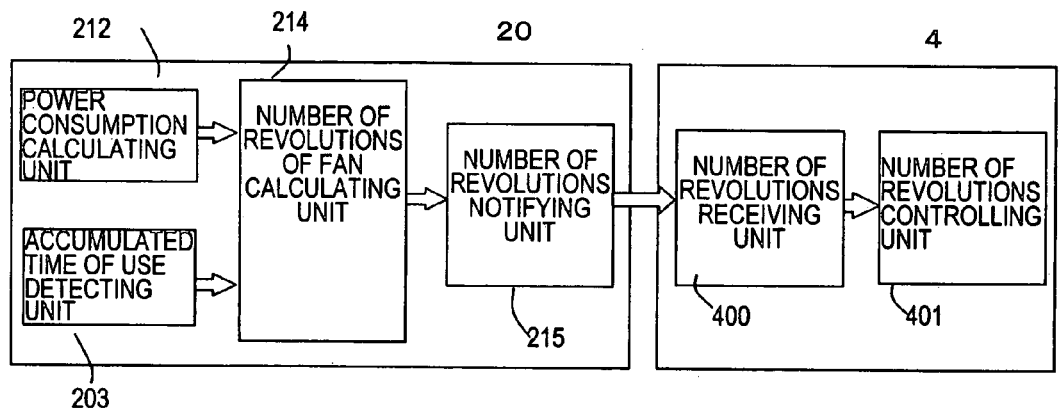
FIG. 11 is an explanatory view of the method of controlling the number of revolution of forced-air-cooling fans 3-1 and 3-2 based on the power consumption calculated in response to the type of a circuit substrate 2.
FIG. 12 shows a table of the number of revolutions of a fan corresponding to combinations of the power consumption and the accumulated time of use of a filter.

FIG. 11 is an explanatory view of the method of controlling the number of revolution of the forced-air-cooling fans 3-1 and 3-2 based on the power consumption calculated as above in response to the type of the circuit substrates 2 mounted.

In the CPU substrate 20, together with the power consumption calculated as above by the power consumption calculating unit 312, information on the accumulated time of use of the forced-air-cooling fans 3-1 and 3-2 is further inputted from an accumulated time of use calculating unit 203 (see FIG. 3) into a number of revolutions of the fan calculating unit 214.

The number of revolutions of the fan calculating unit 214 has, as an example, a table of the number of revolutions of a fan corresponding to combinations of the power consumption as shown in FIG. 12 and the accumulated time of use of a filter.

Referring to the table, the number of revolutions is determined from the relation between the power consumption calculated by the power consumption calculating unit 212, of the circuit boards 2 mounted and the accumulated time of use of the filter obtained by the accumulated time of use detecting unit 203.

For example, when the power consumption of the circuit boards 2 mounted is within the range of C to D (W) and the corresponding accumulated time of use of the filter of the forced-air-cooling fan 3-1 or 3-2 is within the range of 1,000 to 1,500 days, the number of revolutions is set at "f".

Information on the number of revolutions f set as above is converted into a decimal to hexadecimal code by a number of revolutions notifying unit 215 of the CPU substrate 20 and, thereafter, is sent to a number of revolutions receiving unit 400 of the fan card 4. In the fan card 4, a driving current of the corresponding forced-air-cooling fans 3-1 and 3-2 is controlled by a number of revolutions control unit 401 such that the number of revolutions becomes the number of revolutions f that has been received by the number of revolutions receiving unit 400.

INDUSTRIAL APPLICABILITY

As in the above description of the embodiment of the present invention referring to the drawings, according to the present invention, an electric device capable of maintaining the temperature in the apparatus approximately constant at a low cost without installing any temperature sensor can be provided.

An approximately constant temperature can be maintained without any intervention of maintenance personnel in an electronic device. Because the number of revolutions of a forced-air-cooling fan is controlled in response to the apparatus configuration configured by circuit boards mounted therein, revolution operation of the fan more than needed can be omitted, reduction of the power consumption can be realized and a significant industrial benefit can be obtained.

The invention claimed is:

1. A method of controlling a number of revolutions of forced-air-cooling fans in an electronic device having a plurality of circuit boards and the forced-air-cooling fans discharging the heat generated from the plurality of circuit boards through ventilation, and each of which is equipped with a filter, the method comprising the steps of:

obtaining an optimal number of revolutions for each fan from a relation between an accumulated time of use of the filter and a power consumption of the plurality of circuit boards mounted in the electronic device; and controlling a driving current of a forced-air-cooling fan such that the number of the revolutions becomes the obtained number of revolutions.

2. The method of controlling the number of revolutions of forced-air-cooling fans in an electronic device according to claim 1, the method comprising the steps of:

retaining, for each filter, individual identification information, and cleaning information that indicates whether or not cleaning has been completed; and starting counting of the time having passed simultaneously when the filter is mounted and detecting the accumulated time of use of the filter.

3. The method of controlling the number of revolutions of forced-air-cooling fans in an electronic device according to claim 1, wherein a type of, a position of a slot that is mounted with, and a quantity of the plurality of circuit boards mounted in the electronic device are detected, and a power consumption to be loaded on the corresponding forced-air-cooling fans is calculated.

4. An electronic device comprising:

a plurality of slots each capable of being mounted with a circuit board;

a forced-air-cooling fan equipped with a filter, that is respectively equipped corresponding to a pre-determined slot in the plurality of slots;

a fan card having identification information of the filter;

a unit that is inputted with the identification information of the filter read from the fan card and obtains an accumulated time of use of the filter corresponding to the identification information;

a unit that is inputted with information on the circuit boards mounted in the plurality of slots and obtains a power consumption corresponding to the circuit boards mounted; and a unit that obtains a number of revolutions of the forced-air-cooling fan to be set, from a relation between the obtained accumulated time of use of the filter and the power consumption corresponding to the circuit boards mounted.

5. The electronic device according to claim 4, wherein the identification information of the filter is identified using year of manufacture, month of manufacture, and serial number.

6. The electronic device according to claim 4, further comprising a timer, wherein the accumulated time of use of the filter is counted by the timer starting when the filter is newly mounted and, when any change occurs to the identification information of the filter, the counting by the timer is stopped and the accumulated time of use of the filter is obtained from the count value at this time.

* * * * *